United States Patent
Su et al.

(10) Patent No.: US 9,678,146 B2
(45) Date of Patent: Jun. 13, 2017

(54) TEMPERATURE INSENSITIVE TESTING DEVICE AND METHOD

(71) Applicant: REALTEK SEMICONDUCTOR CORPORATION, Hsinchu (TW)

(72) Inventors: Ching-Yao Su, Taichung (TW); Liang-Wei Huang, Hsinchu (TW); Shih-Wei Wang, Pingtung County (TW); Sheng-Fu Chuang, Taichung (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 207 days.

(21) Appl. No.: 14/531,612

(22) Filed: Nov. 3, 2014

(65) Prior Publication Data
US 2015/0185278 A1    Jul. 2, 2015

(30) Foreign Application Priority Data
Dec. 27, 2013   (TW) .............................. 102148910 A (51) Int. Cl.
  *G01R 31/28*   (2006.01)
  *H04L 1/24*    (2006.01)
(52) U.S. Cl.
  CPC ..... *G01R 31/2837* (2013.01); *G01R 31/2841* (2013.01); *H04L 1/243* (2013.01)
(58) Field of Classification Search
  CPC ...................................................... G01R 31/28
  (Continued)

(56) References Cited

U.S. PATENT DOCUMENTS 5,793,819 A * 8/1998 Kawabata ............. H04L 7/0331
                                                           375/326
6,426,979 B1 * 7/2002 Yang ........................ H04B 3/23
                                                           370/291
(Continued)

OTHER PUBLICATIONS

Ching-Yao Su, U.S. Appl. No. 14/323,411(not yet published). Application Date Jul. 3, 2013.

*Primary Examiner* — Son Le
*Assistant Examiner* — Akm Zakaria
(74) *Attorney, Agent, or Firm* — WPAT, P.C., Intellectual Property Attorneys; Anthony King (57) ABSTRACT

The present invention discloses a temperature insensitive testing device comprising: a transmission-end test sequence generating circuit to generate a test sequence; a transmission circuit to process the test sequence according to a transmission clock and thereby generate a test signal; a reception circuit to process an echo of the test signal and generate a digital echo signal; a correlation-value generating circuit to generate correlation values including a maximum correlation value according to the test sequence and the digital echo signal; and a decision circuit to determine whether a relation between the maximum correlation value and at least one threshold satisfies a predetermined condition and thereby generate a decision result, wherein the frequency of the transmission clock is lower than a predetermined frequency which confines the variation of the maximum correlation value to a predetermined range provided that the temperature variation of the transmission cable is within a temperature variation range.

13 Claims, 9 Drawing Sheets

(58) Field of Classification Search
USPC .......................................................... 324/750
See application file for complete search history.

(56) References Cited

U.S. PATENT DOCUMENTS

| | | | |
|---|---|---|---|
| 6,816,542 B1 * | 11/2004 | Komatsu | H04B 1/7113 370/335 |
| 7,979,219 B2 | 7/2011 | Yen et al. | |
| 8,838,184 B2 * | 9/2014 | Burnett | G10L 21/0208 455/569.1 |
| 2007/0194796 A1 * | 8/2007 | Harrison | G01R 31/088 324/534 |
| 2007/0211643 A1 | 9/2007 | Hsieh et al. | |
| 2008/0012576 A1 * | 1/2008 | Sato | G01R 31/31937 324/617 |
| 2008/0288570 A1 * | 11/2008 | Ferchland | H04B 1/707 708/425 |
| 2011/0039509 A1 * | 2/2011 | Bruchner | H04B 1/40 455/232.1 |
| 2011/0317564 A1 * | 12/2011 | Saibi | H04L 43/50 370/249 |

\* cited by examiner

TEMPERATURE INSENSITIVE TESTING DEVICE AND METHOD

BACKGROUND OF THE INVENTION

1. Field of the Invention

The present invention relates to a testing device and method, especially to a temperature insensitive testing device and method.

2. Description of Related Art

Generally speaking, a circuit (e.g. a testing circuit) needs to make use of predetermined parameters to achieve the expected efficiency during operation. However, as some external condition (e.g. environmental temperature) or internal condition (e.g. working voltage) changes, the original predetermined parameters could be no longer the optimal parameters, which means that if the circuit keeps working by referring to these preset parameters, it can't achieve the expected efficiency anymore. Therefore, if an external or internal condition has changed, the circuit needs to acquire the update of the predetermined parameters or modify the parameters to maintain the expected efficiency. According to a known technique, the circuit may adopt a mapping table to store a plurality of parameters in connection with the variation of one or more conditions, and then acquire the appropriate parameters from the mapping table in accordance with the current status of the one or more conditions. Unfortunately, since the variation of a condition (e.g. the variation of temperature) is usually continuous, if one wants to take most of the parameters in connection with the variation into consideration, the mapping table will be enormously huge in storage size and consume a lot of memory space; but if only a few parameters are stored, the circuit will have to execute some approximation calculation (e.g. interpolation calculation) to obtain new parameters for the following operation; in the latter case, not only the new parameters are relatively inaccurate, but also the approximation calculation consumes the operation resource of the circuit.

People who are interested in the prior arts may refer to the following documents: U.S. Pat. No. 7,979,219 (hereafter '219 patent), US patent application of publication number 20070211643 (hereafter '643 patent application), and TW patent application of application number 102129069 (hereafter '069 patent application) in which '219 patent and '643 patent application aim at finding out whether some impedance mismatch or incorrect coupling exists by sending a specific signal to a transmission path while '069 patent aims for updating a few predetermined parameters for more precise determination by carrying out a simplified calculation with these predetermined parameters and a detection result (e.g. temperature detection result). However, '219 patent and '643 patent application nowhere teach how to make an adaptive adjustment (e.g. update of parameters) in response to temperature variation; and the detection result of '069 patent application might reflect the characteristic (e.g. temperature characteristic) of a target inaccurately due to the improper disposition of the circuit or other causes. For instance, in an application of automobile electronics, since the temperature difference between different positions could be extremely significant, if a temperature detecting element is not close to a target enough, the detection result from the temperature detecting element sensing the temperature of the target could be erroneous.

SUMMARY OF THE INVENTION

In view of the problems of the prior arts, an object of the present invention is to provide a temperature insensitive testing device and method capable of improving the prior arts.

The present invention discloses a temperature insensitive testing device capable of outputting a test signal through a transmission line and generating a test result. An embodiment of the temperature insensitive testing device comprises: a transmission-end test sequence generating circuit; a transmission circuit; a reception circuit; a correlation-value generating circuit; and a decision circuit. Said transmission-end test sequence generating circuit is operable to generate a test sequence; said transmission circuit includes: a transmission clock generating unit operable to generate a transmission clock whose frequency is equal to or lower than a predetermined frequency, a digital-to-analog converter operable to convert the test sequence into an analog test signal according to the transmission clock, and a transmission interface circuit operable to generate a test signal according to the analog test signal; said reception circuit includes: a reception interface circuit operable to receive an echo signal of the test signal, a reception clock generating unit operable to generate a reception clock, and an analog-to-digital converter operable generate a digital echo signal by sampling the echo signal according to the reception clock; said correlation-value generating circuit is operable to execute a correlation calculation according to the test sequence and the digital echo signal to thereby generate a plurality of correlation values including a maximum correlation value; and said decision circuit is operable to determine whether a relation between the maximum correlation value and at least one threshold satisfies at least one predetermined condition, so as to generate a decision result, wherein the predetermined frequency restricts the variation of the maximum correlation value within a predetermined range provided that the temperature variation of a concerned transmission line stays within a temperature variation range.

The present invention also discloses a temperature insensitive testing method capable of outputting a test signal via a transmission line and generating a test result. An embodiment of the testing method comprises the following steps: a step of generating a test sequence; a transmission step including: a step of generating a transmission clock whose frequency is equal to or lower than a predetermined frequency, a step of converting the test sequence into an analog test signal according to the transmission clock, and a step of generating a test signal according to the analog test signal; a reception step including: a step of receiving an echo signal of the test signal, a step of generating a reception clock, and a step of generating a digital echo signal by sampling the echo signal according to the reception clock; a step of executing a correlation calculation according to the test sequence and the digital echo signal to thereby generate a plurality of correlation values including a maximum correlation value; and a step of determining whether a relation between the maximum correlation value and at least one threshold satisfies at least one predetermined condition, so as to generate a decision result, wherein the predetermined frequency restricts the variation of the maximum correlation value within a predetermined range provided that the temperature variation of a concerned transmission line stays within a temperature variation range.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The following description is written by referring to terms of this invention field. If any term is defined in this specification, such term should be explained accordingly. Besides, the connection between objects or events in the disclosed embodiments can be direct or indirect provided that these embodiments are still practicable under such connection. Said "indirect" means that an intermediate object or a physical space is existed between the objects, or an intermediate event or a time interval is existed between the events.

The present invention discloses a temperature insensitive testing device and method capable of outputting a test signal via a transmission line and generating a test result, and capable of restricting the variation of the test result within a predetermined range through the control over a clock provided that the temperature variation of the said transmission line stays within a temperature variation range. The device and method are applicable to an integrated circuit (e.g. a wired communication IC) or a system device (e.g. an automobile electronic device such as an event data recorder or an automobile video playback system). Provided that an alternative means is available and reasonable, people of ordinary skill in the art can use such means similar or equivalent to those described in this specification to carry out the present invention, which implies that the scope of this invention is not limited to the embodiments in this specification. On account of that some element of the testing device of the present invention could be known, the detail of such element will be omitted as long as this omission nowhere dissatisfies the specification and enablement requirements. Besides, the testing method can be in the form of firmware and/or software which could be carried out by the testing device of this invention or the equivalent thereof; therefore, provided that the remaining disclosure is still enough for understanding and enablement, the following description will abridge the hardware details for carrying out the method, but put the emphasis on the steps.

In order to implement the testing device and method of the present invention, this invention generates the aforementioned test signal in accordance with a test sequence, then samples the echo of the test signal to generate one or more sets of reception sequences, and then executes a correlation calculation according to the one or more sets of reception sequences and one or more sets of the test sequences to generate the aforementioned test result. An example of said test sequence is a pseudo noise sequence (hereafter PN Sequence) or the sequence derived therefrom. Through the periodic autocorrelation characteristic of PN sequence, the present invention is able to analyze the variation of a plurality of correlation values to obtain the relation between the test signal and the echo thereof, and then derive the channel response from the relation to find out the status of the transmission line. People who are interested in the introduction of PN sequence may refer to the chapter 13-2-4 of Digital Communications written by John G Proakis (Publisher: McGraw-Hill Higher Education, 2001) or other documents having similar introductions. Please note that the present invention may adopt other types of test sequence provided that the consequent implementation is practicable.

Figure 1:
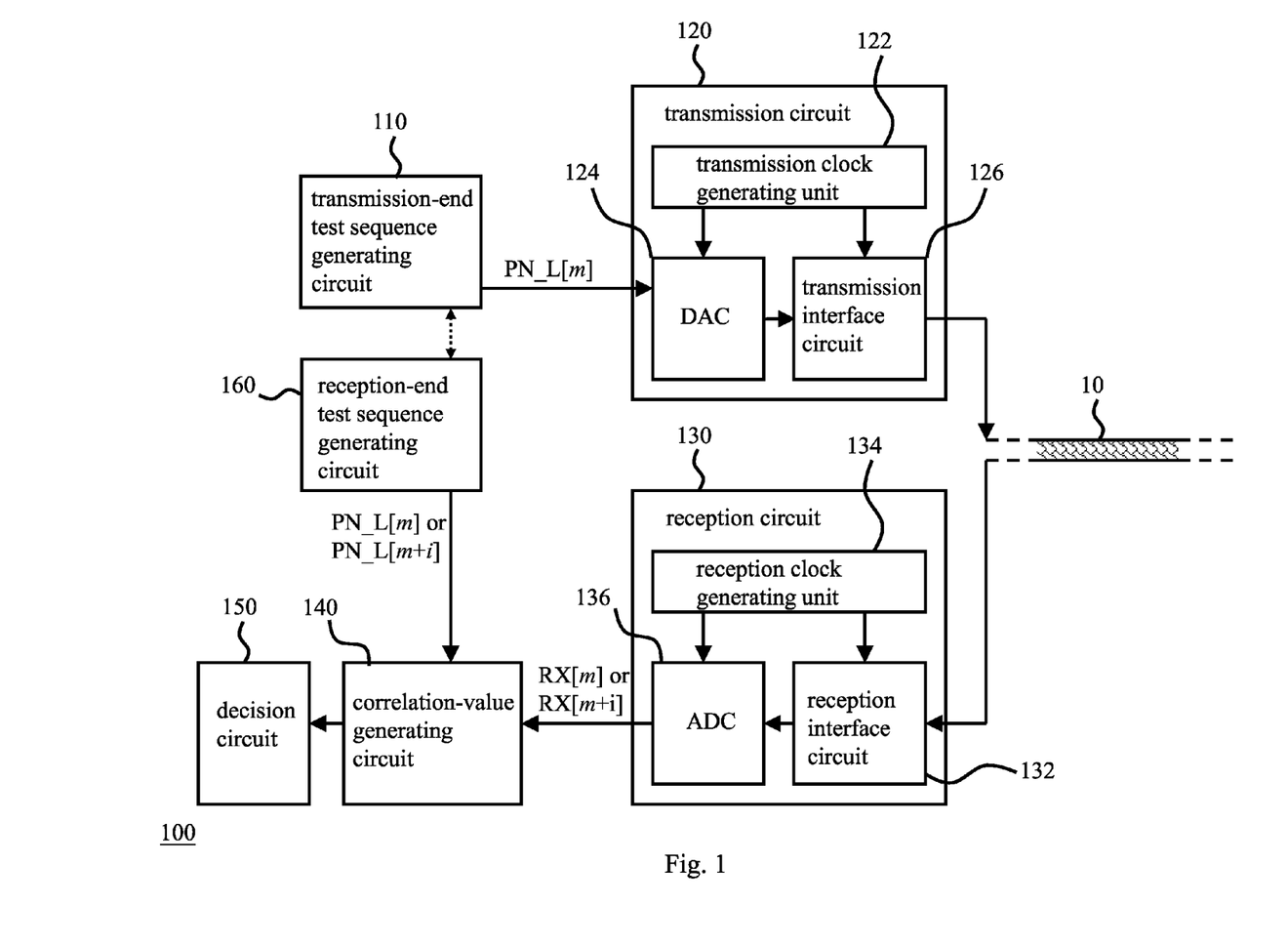
FIG. 1 illustrates an embodiment of the temperature insensitive testing device of the present invention.

Please refer to FIG. 1 which illustrates an embodiment of the temperature insensitive testing device of the present invention. As it is shown in FIG. 1, the testing device 100 comprises: a transmission-end test sequence generating circuit 110; a transmission circuit 120; a reception circuit 130; a correlation-value generating circuit 140; and a decision circuit 150. Said transmission-end test sequence generating circuit 110 is operable to generate a test sequence. Said transmission circuit is operable to generate a test signal according to the test sequence, and includes: a transmission clock generating unit 122 operable to generate a transmission clock whose frequency is restrained from exceeding a predetermined frequency which is 31.25 MHz in compliance with an experimental result or could be determined by an environmental parameter (e.g. the type of transmission line, the range of temperature variation) or user demands; a digital-to-analog converter (DAC) 124 operable to convert one or more sets of the test sequences into an analog test signal according to the transmission clock; and a transmission interface circuit 126 operable to generate a test signal according to the analog test signal and then output the test signal to a transmission line 10. Said reception circuit 130 is operable to receive the echo of the test signal, and includes: a reception interface circuit 132; a reception clock generating unit 134; and an analog-to-digital converter (ADC) 136. The reception interface circuit 132 is operable to receive an echo signal of the test signal from the transmission line 10; if some circumstance like impedance mismatch or open circuit in connection with the transmission line 10 happens, the intensity of the echo signal will change accordingly; in other words, the echo signal is associated with the test signal which could be affected by channel response. The reception clock generating unit 134 is operable to generate a reception clock whose frequency is M times the frequency of the transmission clock in the present embodiment in which the M (e.g. a positive integer) is not less than one. The analog-to-digital converter 136 is operable generate a digital echo signal by sampling the echo signal according to the reception clock; more specifically, the digital echo signal relates to one or more sets of the test sequences suffering channel response (hereafter reception sequence(s)), and if the digital echo signal includes plural sets of reception sequences, the analog-to-digital converter 136 will sample the echo signal in light of a sampling delay arrangement to thereby generate these sets of reception sequences successively in which the sampling delay arrangement could be a delay interval between the timings for sampling adjacent two of the reception sequences in compliance with the sampling order. Said correlation-value generating circuit 140 is operable to execute a correlation calculation according to the test sequence and the digital echo signal and thereby generate a plurality of correlation values including a maximum correlation value as the indication reflecting the characteristic or status of the transmission line 10 at the moment. For instance, the digital echo signal is composed of a plurality sets of reception sequences generated one by one; consequently, the correlation-value generating circuit 140 carries out the said correlation calculation by correlating the original test sequence with each of the reception sequences to generate a correlation value accordingly, and eventually generates the plurality of correlation values. For another instance, the digital echo signal is a single reception sequence; therefore, the correlation-value generating circuit 140 executes the correlation calculation by correlating a plurality sets of the test sequences of different phases with the reception sequence, thereby generates a correlation value with every set of the test sequence and the reception sequence, and finally generates the plurality of correlation values. At last, said decision circuit 150 is coupled with the correlation-value generating circuit 140, and operable to determine whether a relation between the maximum correlation value and at least one threshold satisfies at least one predetermined condition (e.g. to determine whether the maximum correlation value stays within a range of a threshold plus and minus 1.5 dB), so as to generate a decision result, wherein the aforementioned frequency limitation to the transmission clock (i.e. the predetermined frequency) restricts the variation of the maximum correlation value within a predetermined range (e.g. 3 dB) provided that the temperature variation of the transmission line 10 stays within a temperature variation range (e.g. the temperature interval between −40° C. and 80° C.). Accordingly, as long as the temperature variation of the transmission line 10 doesn't exceed the temperature variation range, the maximum correlation value will be able to reflect the characteristic or status of the transmission line 10 relatively accurately.

Please refer to FIG. 1 again. The present embodiment may further comprises: a reception-end test sequence generating circuit 160 operable to generate identical A set(s) of the test sequence(s) for the execution of the correlation calculation, wherein the A is a positive integer, and if the A is more than one, the phases of the A sets of the test sequences are different. For instance, provided that the A is 1, the reception-end test sequence generating circuit 160 could be a storage circuit which is coupled with the transmission-end test sequence generating circuit 110 and operable to store the test sequence generated therefrom for the execution of the correlation calculation. For another instance, provided that the A is 1, the reception-end test sequence generating circuit 160 could be a test sequence generating unit operable to generate the same test sequence for the correlation calculation. For yet another instance, provided that the A is more than 1, the reception-end test sequence generating circuit 160 includes a delay circuit which is coupled to the transmission-end test sequence generating circuit 110 and operable to generate A sets of the test sequences of different phases according to the test sequence from the circuit 110 for exploitation. For a further instance, provided that the A is more 1, the reception-end test sequence generating circuit 160 includes a test sequence generating unit and a delay circuit in which the test sequence generating unit is operable to generate the prescribed test sequence while the delay circuit is operable to generate A sets of the test sequences of different phases according to the test sequence for exploitation. Please note that in the above-mentioned instances, each of the storage circuit, the delay circuit and the test sequence generating unit by itself is known in this field, and thus the detail thereof is omitted; please also note that these instances are merely for people of ordinary skill in the art to understand the present embodiment, which means that other techniques capable of generating the A set(s) of the test sequence(s) could be adopted by the present invention; please further note that the correlation-value generating circuit 140 may carry out the correlation calculation in accordance with the test sequence directly from the transmission-end test sequence generating circuit 110.

Figure 2:
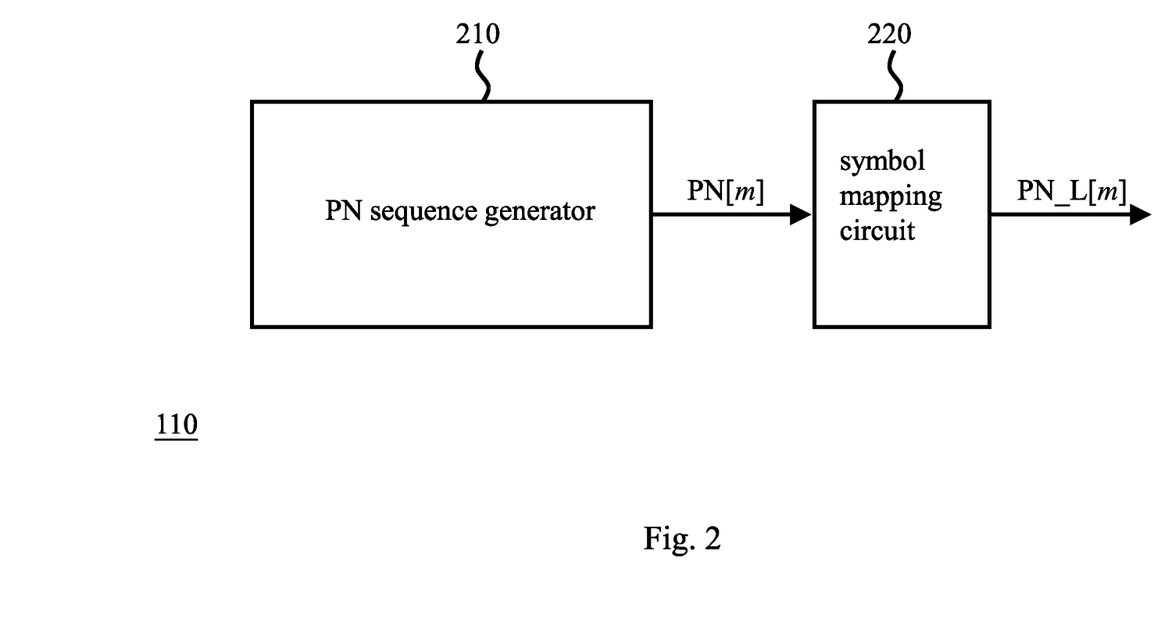
FIG. 2 illustrates an embodiment of the transmission-end test sequence generating circuit in FIG. 1.

Please refer to FIG. 2 which illustrates an embodiment of the transmission-end test sequence generating circuit 110 in FIG. 1. As it is shown in FIG. 2, the transmission-end test sequence generating circuit 110 includes: a PN sequence generator 210 and a symbol mapping circuit 220. Said PN sequence generator 210 could be a known PN sequence generator or a self-designed one operable to generate a PN sequence PN[m] whose cycle (or number of bits) is n (which is an integer more than 1), wherein the sequence PN[m] is equal to the sequence PN[m+n] because of the periodic autocorrelation characteristic of PN sequence, the unit amount of the cycle n could be the period of a single clock of the transmission clock generating unit 122, the variable m satisfies the equation $0 \leq m \leq n-1$, and each value of the variable m is associated with a bit value (or the 1/n cycle) of the sequence PN[m]. The symbol mapping circuit 220 is operable to convert each bit value of the PN sequence PN[m] into an appropriate level (e.g. to convert the bit value 1 into a positive level 1 and the bit value 0 into a negative level −1), so as to generate a corresponding level sequence PN_L[m] as the aforementioned test sequence. However, through a known design, the digital-to-analog converter 124 could be operable to turn the PN sequence PN[m] into an appropriate analog signal for the following procedure; in the meantime, the symbol mapping circuit 220 could be eliminated while the PN sequence PN[m] is treated as the aforementioned test sequence.

Figure 3A:
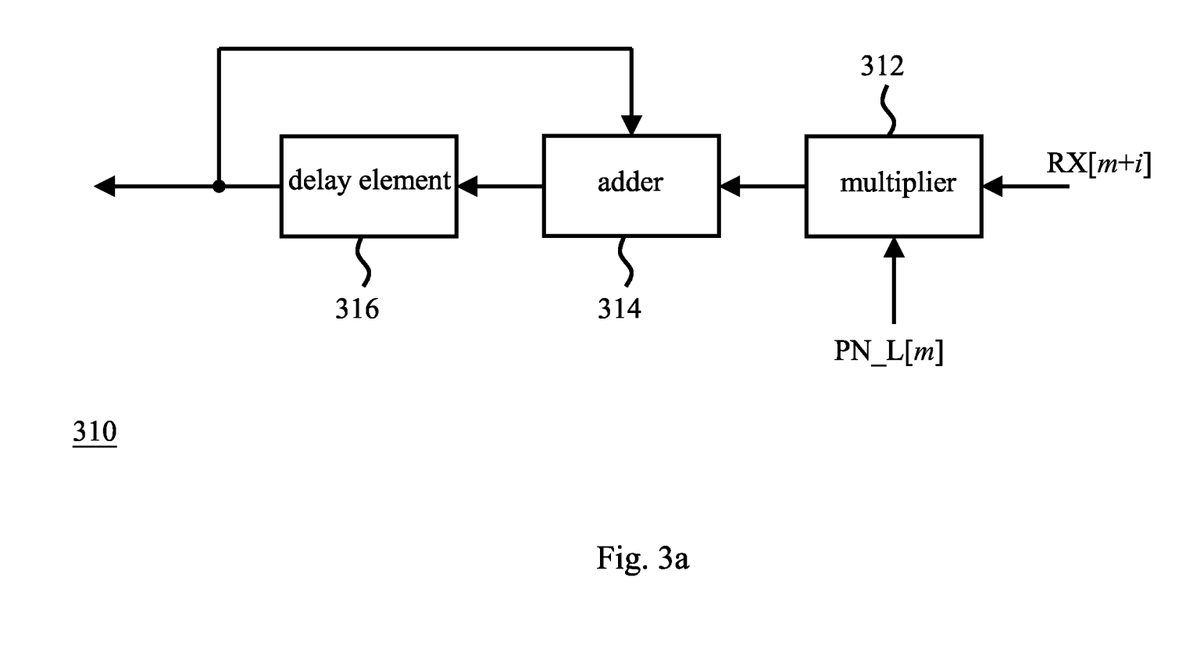
FIG. 3a illustrates an embodiment of the correlation-value generating circuit in FIG. 1.
Figure 3B:
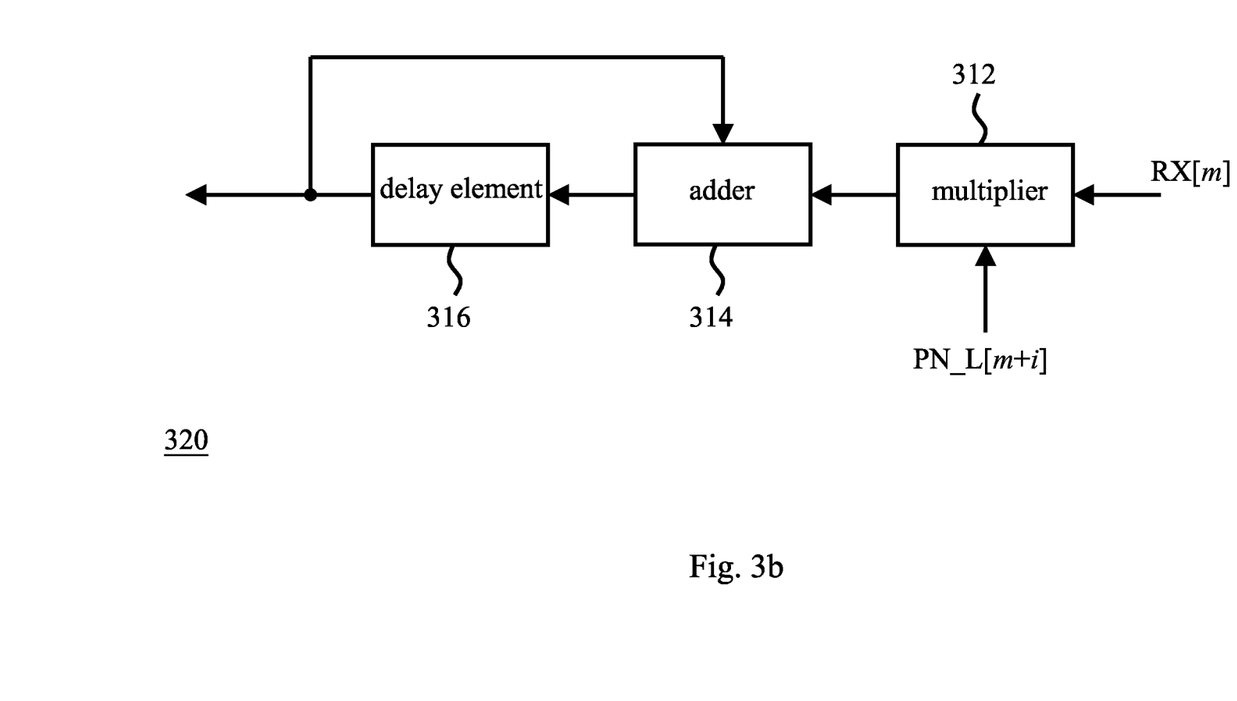
FIG. 3b illustrates another embodiment of the correlation-value generating circuit in FIG. 1.
Figure 3C:
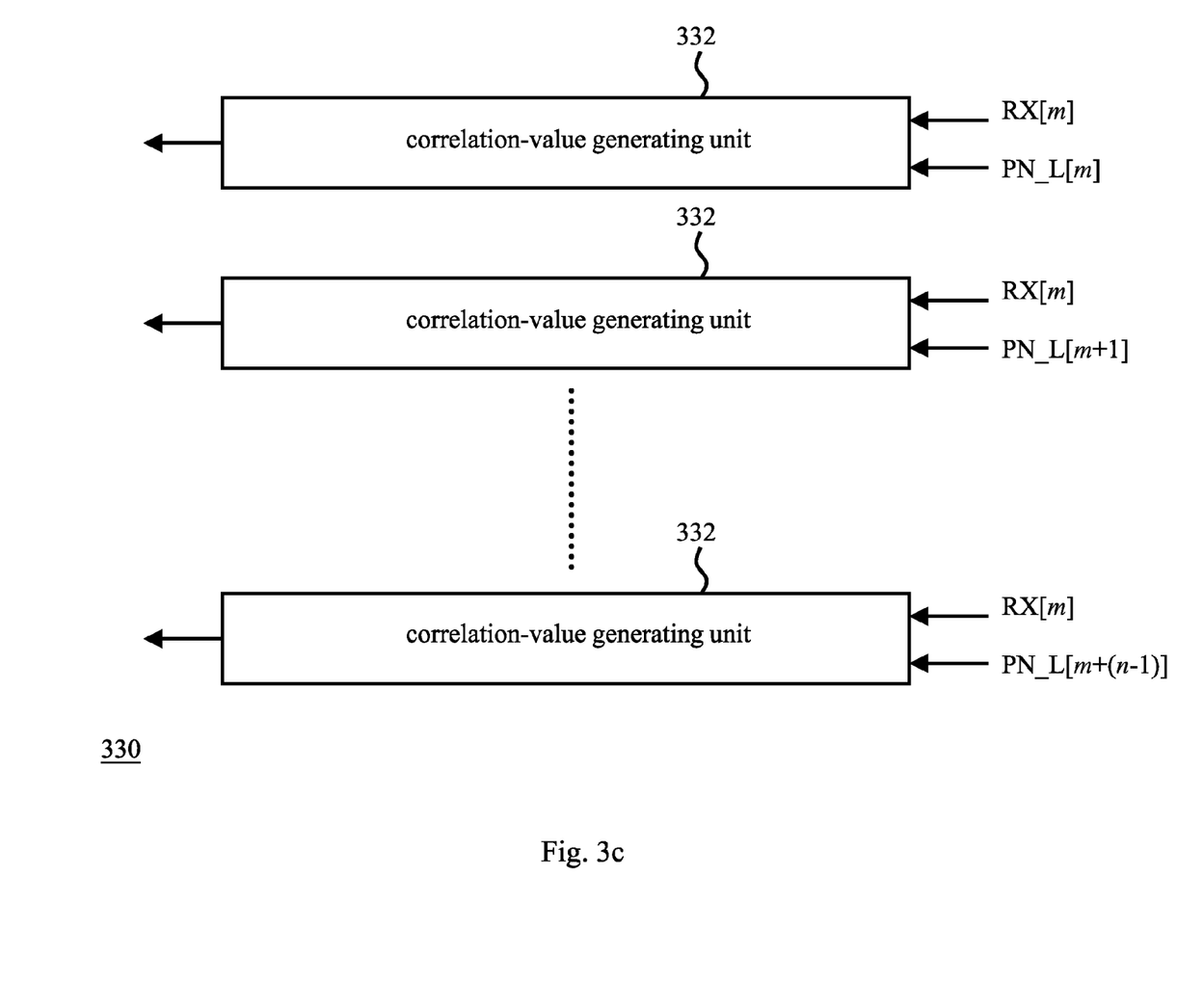
FIG. 3c illustrates a further embodiment of the correlation-value generating circuit in FIG. 1.

Please refer to FIG. 3a through FIG. 3c showing several embodiments of the correlation-value generating circuit 140 in FIG. 1. As it is shown in FIG. 3a, provided that the aforementioned digital echo signal includes n sets of reception sequences RX[m+i] (in which i are integers between 0 and n−1, and represent different kinds of sampling timings), the correlation-value generating circuit 310 includes: a multiplier 312, an adder 314 and a delay element 316. Said multiplier 312 is operable to multiply the n sets of reception sequences RX[m+i] by one set of the test sequence PN_L[m] in turn and thereby generate n sets of multiplication values RX[m+i]·PN_L[m]; each set of multiplication values includes n multiplication values (i.e. RX[0+i]·PN_L[0], RX[1+i]·PN_L[1], . . . , RX[(n−1)+i]. PN_L[(n−1)]); however, providing the aforementioned PN sequence PN[m] is composed of 1 and 0 and the level sequence thereof (i.e. the test sequence in the present embodiment) PN_L[m] is composed of 1 and −1, the sequence (2PN[m]−1) will be equal to the test sequence PN_L[m]; in other words, the multiplier 312 may execute the calculation according to the sequence (2PN[m]·1) instead of the test sequence PN_L[m]. Said adder 314 is coupled with the multiplier 312, and operable to sum up a preceding addition value and a current multiplication value among the above-mentioned n multiplication values to thereby generate a current addition value and so on and so forth, so that the n multiplication values will be summed up to generate a correlation value; subsequently, the adder 314 can carry out the summation of the next set of multiplication values to thereby generate a next correlation value and so on and so forth, so that n correlation values will be obtained. Said delay element 316 is operable to delay a current addition value to thereby generate a preceding addition value, and then feed the preceding addition value back to the adder 314, so that the adder 314 can add up the preceding addition value and a current multiplication value to generate a current addition value. Please note that the said adder 314 or delay element 316 is operable to output the n correlation values to the decision circuit 150 for the decision making under the control of a reset circuit (e.g. a counting circuit capable of counting in an periodical and repeated way, which is not shown in the figures); this rest circuit is operable to reset the feedback value (e.g. to make the feedback value return to 0 after reaching a counting value) outputted from the delay element 316 to the adder 314, so as to allow the correlation-value generating circuit 310 to calculate a next correlation value.

On the basis of the above description, the correlation-value generating circuit 320 in FIG. 3b itself is the same as the correlation-value generating circuit 310 in FIG. 3a; what is different is that the digital echo signal in FIG. 3b is a single reception sequence RX[m]; meanwhile the multiplier 312 is operable to multiply the single reception sequence RX[m] by n sets of the test sequences of different phases PN_L[m+i] in turn (in which the i are integers between 0 and n−1 and represent different kinds of phases), so as to generate n sets of multiplication values RX[m]·PN_L[m+i] which are theoretically equivalent to the n sets of multiplication values RX[m+i]·PN_L[m] in FIG. 3a. Besides, under the circumstance that the digital echo signal is a single reception sequence RX[m], the correlation-value generating circuit 330 in FIG. 3c includes n correlation-value generating units 332, each of which is identical to the correlation-value generating circuit 310 in FIG. 3a, but aims at generating a single correlation value in accordance with the reception sequence RX[m] and one of the n sets of the test sequences of different phases PN_L[m+i] (i.e. PN_L[m], PN_L[m+1], . . . , PN_L[m+(n−1)]), so that these correlation-value generating units are also able to generate n correlation values. Please note that people of ordinary skill in the art may choose one of the circuits in FIG. 3a through FIG. 3c or the equivalent thereof to generate the correlation values.

In light of the description of FIG. 1 through FIG. 3c, under a circumstance of total reflection and loss-less transmission, after the test sequence PN_L[m] from the transmission end went through the digital-to-analog conversion, transmission process, reception process and sampling process, the reception sequence RX[m] of the digital echo signal will be obtained and theoretically equivalent to the test sequence PN_L[m−k] of the transmission end in which the k represents the delay amount between the transmission end and the reception end. Furthermore, the test sequence PN_L[m−k] is supposed to be equivalent to the sequence PN_L[m−k+n] due to the periodic repetition characteristic of PN sequence, and the sequence PN_L[m−k] could be expressed as PN_L_k[m] and so on and so forth. Accordingly, the correlation values R[i] between the test sequence PN_L[m] and the reception sequences RX[m+i] (in which the i are integers between 0 and n−1, and represent different kinds of sampling timings) at the reception end for the correlation calculation could be derived as follows:

$$R[i] = \frac{1}{n}\sum_{m=0}^{n-1} PN\_L[m] \cdot RX[m+i] \quad \text{(Equation 1)}$$

$$= \frac{1}{n}\sum_{m=0}^{n-1} PN\_L[m] \cdot PN\_L[m+i-k]$$

$$\approx \delta[i-k]$$

In the above equation $\delta[i-k]$ is 1 (if i=k) or 0 (if i≠k), and (1/n) is introduced for normalization. Consequently, according to Equation 1, the following equations can be obtained:

$$R[i]=1 \text{ (if } i=k\text{) or } R[i]=-(1/n) \text{ (if } i\neq k\text{)} \quad \text{(Equation 2)}$$

Furthermore, if the delay amount k equals to 0 (i.e. RX[m]=PN_L[m]), Equation 2 can be re-expressed as the follows:

$$R[i]=1 \text{ (if } i=0\text{) or } R[i]=-(1/n) \text{ (if } i\neq 0\text{)} \quad \text{(Equation 3)}$$

According to Equation 3, if n is a peak value, the correlation value R[i] will approximate to $\delta[i]$. In light of the above, if Equation 1 is expressed by convolution, the following equation can be obtained:

$$R[i] = \frac{1}{n}\sum_{m=0}^{n-1} PN\_L[m+i-k] \cdot PN\_L[m] \quad \text{(Equation 4)}$$

$$= \frac{1}{n}\sum_{m=0}^{n-1} PN\_L\_k[m+i] \cdot PN\_L[m]$$

$$= \frac{1}{n}\sum_{m'=i}^{n-1+i} PN\_L\_k[m'] \cdot PN\_L[m'-i]$$

$$= \frac{1}{n} PN\_L\_k[i] * PN\_L[-i]$$

$$= \frac{1}{n} PN\_L[i-k] * PN\_L[-i]$$

$$\approx \delta[i-k]$$

In the meantime, if the transmission condition doesn't comply with the total reflection and loss-less transmission circumstance any longer, which means that a channel response $h_{total}[m]$ should be taken into consideration, the relation between the test sequence PN_L[m] at the transmission end and the reception sequence RX[m] at the reception end can be expressed as follows:

$$RX[m]=PN\_L[m]*h_{total}[m] \quad \text{(Equation 5)}$$

In which the symbol "*" stands for convolution. Based on Equation 1, Equation 4, and Equation 5, the following equation can be obtained:

$$R[i] = \frac{1}{n}\sum_{m=0}^{n-1} PN\_L[m] \cdot RX[m+i] \quad \text{(Equation 6)}$$

$$= \frac{1}{n} PN\_L[-i] * RX[i]$$

$$= \frac{1}{n} PN\_L[-i] * PN\_L[i] * h_{total}[i]$$

$$\approx \delta[i] * h_{total}[i]$$

$$= h_{total}[i]$$

As a result, the above description has demonstrated that through the adjustment in the sampling timing (i.e. the value of i) of the reception sequences RX[m+i], the reception sequences RX[m+i] of n kinds of sampling timings can be correlated with the test sequence PN_L[m] respectively, and then n correlation values R[i] can be obtained to express the channel response $h_{total}[m]$ in which the value of i in connection with the maximum value among the n correlation values R[i] is associated with the delay amount k between the signal transmission and reception. Please note that although the above explanation takes the adjustment in the sampling timing of the reception sequence RX[m+i] for example, those of ordinary skill in the art can derive a similar result from the way of making the sampling timing of the reception sequence constant (i.e. making the reception sequence be RX[m]) and generating a plurality sets of test sequences (i.e. PN_L[m+i] in which the i are integers between 0 and n−1, and represent different kinds of phases).

Figure 4:
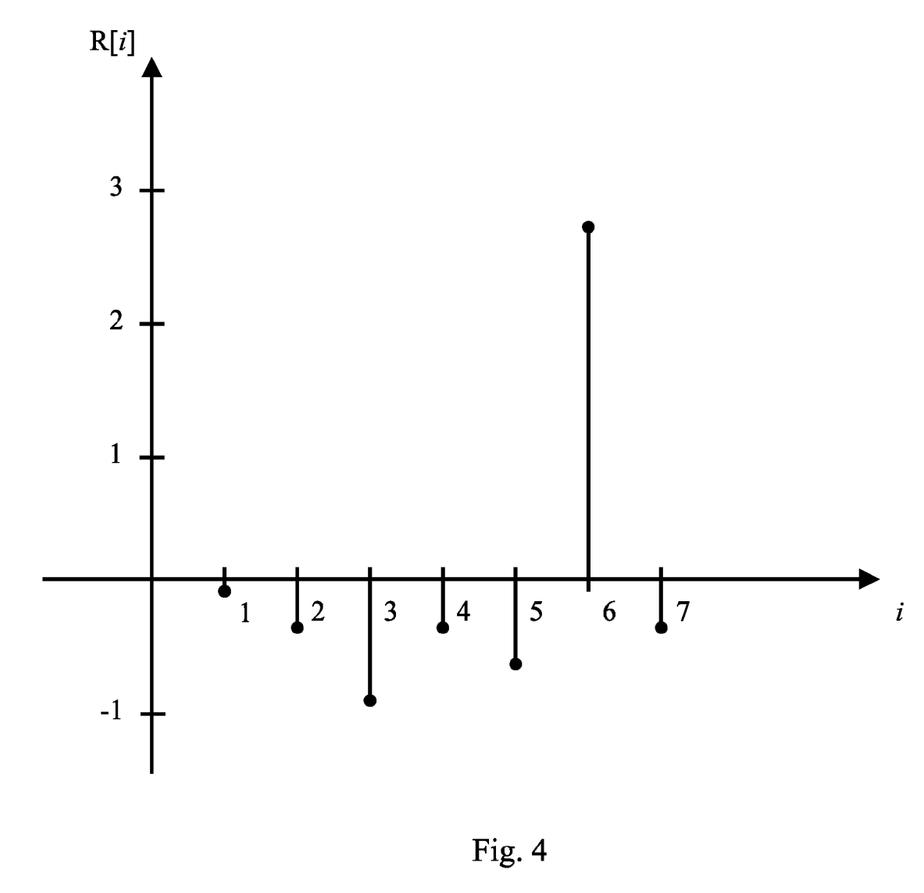
FIG. 4 illustrates an example of the correlation values generated by the correlation-value generating circuit in FIG. 1.

In light of the above description, here is an example. Please refer to FIG. 1, FIG. 2, FIG. 3b (or FIG. 3c) and the explanation thereof; under a circumstance that the frequencies of the transmission and reception clocks are the same, when the transmission circuit 120 outputs a test sequence (1 −1 −1 1 1 −1) according to a PN sequence (1 0 0 1 1 1 0), the reception-end test sequence generating circuit 160 is operable to generate seven sets of the test sequences of different phases as follows for the execution of the correlation calculation: (1 −1 −1 1 1 1 −1), (−1 1 −1 −1 1 1 1), (1 −1 1 −1 −1 1 1), (1 1 −1 1 −1 −1 1), (1 1 1 −1 1 −1 −1), (−1 1 1 1 −1 1 −1), and (−1 −1 1 1 1 −1 1). The digital echo signal (that is to say the reception sequence) is (000 110 101 111 001 110 000), which is derived from the original test sequence (1 −1 −1 1 1 1 −1) gone through the digital-to-analog conversion, transmission process, reception process and s bits sampling process (in which s=3 in this example). For the simplification of explanation, the following setting is adopted: the output voltage level range of the analog-to-digital converter 136 staying between ±3.5V (or some higher voltages); and the voltage levels in connection with the digital echo signal (000 110 101 111 001 110 000) being (−3.5 2.5 1.5 3.5 −2.5 2.5 −3.5). Therefore, the correlation-value generating circuit 140 is operable to carry out the aforementioned correlation calculation in accordance with the said seven sets of the test sequences of different phases and the voltage levels of the digital echo signal, and obtain seven correlation values as they are shown below and in FIG. 4.

corr(1 −1 −1 1 1 1 −1, −3.5 2.5 1.5 3.5 −2.5 2.5 −3.5)=(−3.5+(−2.5)+(−1.5)+3.5+(−2.5)+2.5+3.5)/7=−0.5/7;

corr(−1 1 −1 −1 1 1 1, −3.5 2.5 1.5 3.5 −2.5 2.5 −3.5)=(3.5+2.5+(−1.5)+(−3.5)+(−2.5)+2.5+(−3.5))/7=−2.5/7;

corr(1 −1 1 −1 −1 1 1, −3.5 2.5 1.5 3.5 −2.5 2.5 −3.5)=(−3.5+(−2.5)+1.5+(−3.5)+2.5+2.5+(−3.5))/7=−6.5/7;

corr(1 1 −1 1 −1 −1 1, −3.5 2.5 1.5 3.5 −2.5 2.5 −3.5)=(−3.5+2.5+(−1.5)+3.5+2.5+(−2.5)+(−3.5))/7=−2.5/7;

corr(1 1 1 −1 1 −1 −1, −3.5 2.5 1.5 3.5 −2.5 2.5 −3.5)=(−3.5+2.5+1.5+(−3.5)+(−2.5)+(−2.5)+3.5)/7=−4.5/7;

corr(−1 1 1 1 −1 1 −1, −3.5 2.5 1.5 3.5 −2.5 2.5 −3.5)=(3.5+2.5+1.5+3.5+2.5+2.5+3.5)/7=19.5/7; and corr(−1 −1 1 1 1 −1 1, −3.5 2.5 1.5 3.5 −2.5 2.5 −3.5)=(3.5+(−2.5)+3.5+1.5+(−2.5)+(−2.5)+(−3.5))/7=−2.5/7.

In which the abbreviation "corr" represents the correlation calculation; the test sequence (−1 1 1 1 −1 1 −1) associated with the maximum correlation value 19.5/7 is different from the original test sequence (1 −1 −1 1 1 1 −1) by the delay amount of five seventh the cycle of the test sequence, which means that the delay amount between the signal transmission and reception is around (y+5/7) the cycle (i.e. y times the cycle of the test sequence plus five transmission clocks) in which the y is an integer not less than 0. After obtaining the maximum correlation value, the decision circuit 150 is operable to determine whether the relation between the maximum correlation value and the at least one threshold satisfies the aforementioned predetermined condition, and thereby generate the decision result. For instance, if the maximum correlation value is greater than the at least one threshold, the inference of impedance mismatch or open circuit of the transmission line 10 can be drawn.

For another example. Please refer to FIG. 1, FIG. 2, FIG. 3a and the explanation thereof. Under a circumstance similar to that of the above-mentioned example, when the transmission circuit 120 periodically outputs the test signal in response to the test sequence (−1 1 1 1 −1 1 −1), the reception circuit 130 will execute sampling in accordance with a sampling delay arrangement (in this example the sampling delay arrangement making the delay interval between the timings for sampling adjacent two of the reception sequences progressively increase according to the sampling order) and thereby generate the digital echo signal including seven sets of reception sequences of different phases as follows:

(111 001 110 000 000 110 101) (the corresponding voltage levels 3.5 −2.5 2.5 −3.5 −3.5 2.5 1.5);

(001 110 000 000 110 101 111) (the corresponding voltage levels −2.5 2.5 −3.5 −3.5 2.5 1.5 3.5);

(110 000 000 110 101 111 001) (the corresponding voltage levels 2.5 −3.5 −3.5 2.5 1.5 3.5 −2.5);

(000 000 110 101 111 001 110) (the corresponding voltage levels −3.5 −3.5 2.5 1.5 3.5 −2.5 2.5);

(000 110 101 111 001 110 000) (the corresponding voltage levels −3.5 2.5 1.5 3.5 −2.5 2.5 −3.5);

(110 101 111 001 110 000 000) (the corresponding voltage levels 2.5 1.5 3.5 −2.5 2.5 −3.5 −3.5); and (101 111 001 110 000 000 110) (the corresponding voltage levels 1.5 3.5 −2.5 2.5 −3.5 −3.5 2.5).

Figure 5:
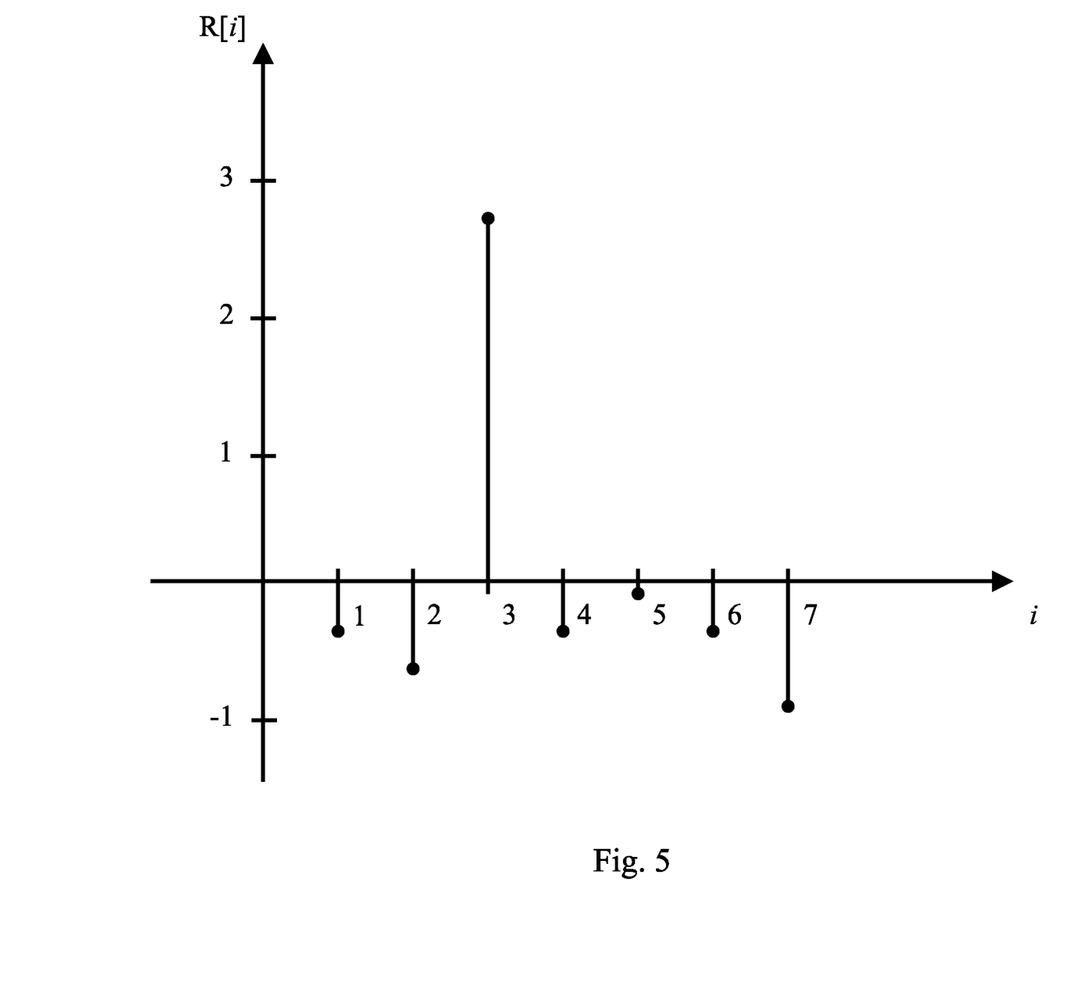
FIG. 5 illustrates another example of the correlation values generated by the correlation-value generating circuit in FIG. 1.

Meanwhile, the correlation-value generating circuit 140 is operable to carry out the correlation calculation by correlating the voltage levels of the seven sets of reception sequences with one set of the original test sequence (1 −1 −1 1 1 1 −1) according to the sampling order, so as to sequentially obtain seven correlation values as they are shown below and in FIG. 5.

corr(1 −1 −1 1 1 1 −1, 3.5 −2.5 2.5 −3.5 −3.5 2.5 1.5)=(3.5+2.5+(−2.5)+(−3.5)+(−3.5)+2.5+(−1.5))/7=−2.5/7;

corr(1 −1 −1 1 1 1 −1, −2.5 2.5 −3.5 −3.5 2.5 1.5 3.5)=(−2.5+(−2.5)+3.5+(−3.5)+2.5+1.5+(−3.5))/7=−4.5/7;

corr(1 −1 −1 1 1 1 −1, 2.5 −3.5 −3.5 2.5 1.5 3.5 −2.5)=(2.5+3.5+3.5+2.5+1.5+3.5+2.5)/7=19.5/7;

corr(1 −1 −1 1 1 1 −1, −3.5 −3.5 2.5 1.5 3.5 −2.5 2.5)=(−3.5+3.5+(−2.5)+1.5+3.5+(−2.5)+(−2.5))/7=−2.5/7;

corr(1 −1 −1 1 1 1 −1, −3.5 2.5 1.5 3.5 −2.5 2.5 −3.5)=(−3.5+(−2.5)+(−1.5)+3.5+(−2.5)+2.5+3.5)/7=−0.5/7;

corr(1 −1 −1 1 1 1 −1, 2.5 1.5 3.5 −2.5 2.5 −3.5 −3.5)=(2.5+(−1.5)+(−3.5)+(−2.5)+2.5+(−3.5)+3.5)/7=−2.5/7; and corr(1 −1 −1 1 1 1 −1, 1.5 3.5 −2.5 2.5 −3.5 −3.5 2.5)=(1.5+(−3.5)+2.5+2.5+(−3.5)+(−3.5)+(−2.5))/7=−6.5/7.

Similarly, the reception sequence (110 000 000 110 101 111 001) associated with the maximum correlation value 19.5/7 is different from the first reception sequence (111 001 110 000 000 110 101) by the delay amount of (y+2/7) the cycle of the reception sequence, which means that the delay amount between the signal transmission and reception is around (y+2/7) the cycle. As it is described before, after obtaining the maximum correlation value, the decision circuit 150 is operable to determine whether the relation between the maximum correlation value and the at least one threshold satisfies the aforementioned predetermined condition, and thereby generate the decision result.

For a further example, under a circumstance that the frequency of the transmission clock is a half of the frequency of the reception clock while the other conditions are similar to those of the above-mentioned example, the digital echo signal derived from the original test sequence (−1 1 1 1 −1 1 −1) which is periodically outputted and goes through the digital-to-analog conversion, transmission process, reception process and sampling process includes four sets of reception sequences as follows:

(000 001 110 101 110 111 111 001 001 110 101 000 000) (the corresponding voltage levels (−3.5 −2.5 2.5 1.5 1.5 2.5 3.5 3.5 −2.5 −2.5 2.5 1.5 −3.5 −3.5));

(101 110 111 111 001 001 110 101 000 000 000 001 110 101) (the corresponding voltage levels (1.5 2.5 3.5 3.5 −2.5 −2.5 2.5 1.5 −3.5 −3.5 −3.5 −2.5 2.5 1.5));

(001 001 110 101 000 000 000 001 110 101 101 110 111 111) (the corresponding voltage levels (−2.5 −2.5 2.5 1.5 −3.5 −3.5 −3.5 −2.5 2.5 1.5 1.5 2.5 3.5 3.5)); and (000 000 000 001 110 101 101 110 111 111 001 001 110 101) (the corresponding voltage levels (−3.5 −3.5 −3.5 −2.5 2.5 1.5 1.5 2.5 3.5 3.5 −2.5 −2.5 2.5 1.5)).

Figure 6:
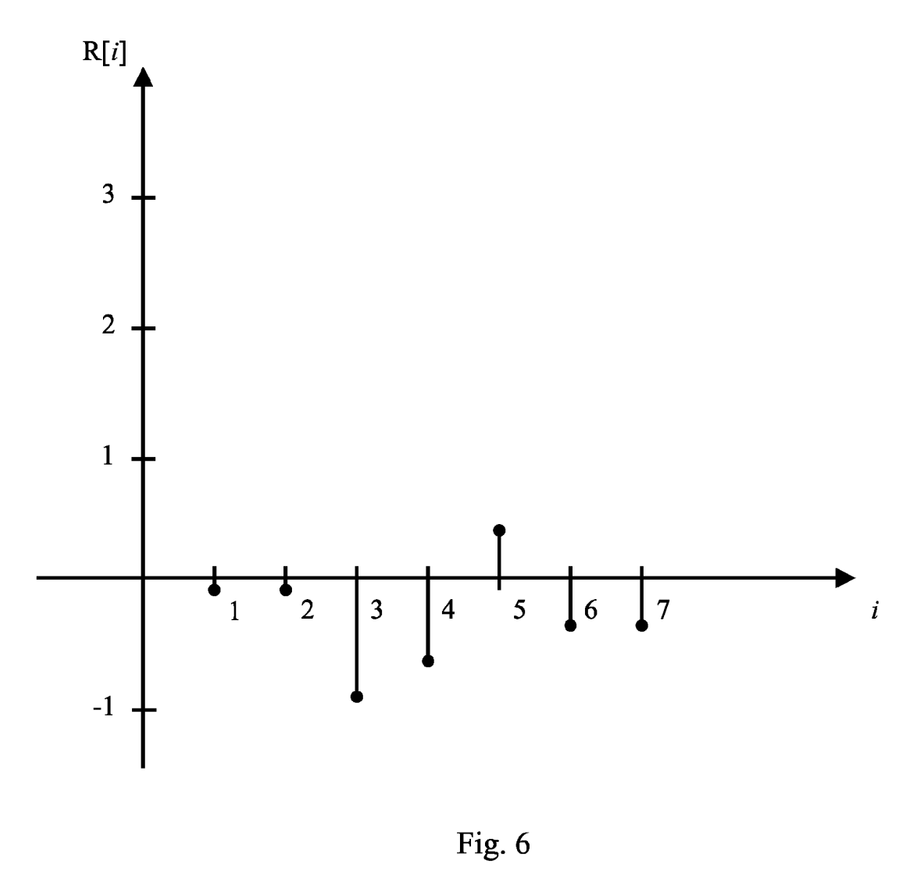
FIG. 6 illustrates a further example of the correlation values generated by the correlation-value generating circuit in FIG. 1.

The delay interval between the timings for sampling adjacent two of the said reception sequences is four reception clocks (i.e. the time interval between the moments of generating two successive reception sequences is (1+4/7) the cycle of a reception sequence); in the meantime, the correlation-value generating circuit 140 is operable to divide each set of reception sequence into two sets of divisional sequences, so that the sequence length of each divisional sequence will be equal to the length of the test sequence and the correlation calculation can be carried out thereafter. For instance, each set of reception sequence is divided into an odd number divisional sequence and an even number divisional sequence; then the correlation-value generating circuit 140 is operable to process the odd and even number divisional sequences through two correlation-value generating units respectively to thereby generate two correlation values correspondingly (in which each correlation-value generating unit could be the correlation-value generating unit 332 in FIG. 3c or the equivalent thereof); and after all the four sets of reception sequences have been processed, eight correlation values can be obtained. Since the cycle of the original test sequence (1 −1 −1 1 1 1 −1) is 7, seven values among the eight correlation values are therefore picked as follows (as shown in FIG. 6):

corr(1 −1 −1 1 1 1 −1, −3.5 2.5 1.5 3.5 −2.5 2.5 −3.5)=(−3.5+(−2.5)+(−1.5)+3.5+(−2.5)+2.5+3.5)/7=−0.5/7;

corr(1 −1 −1 1 1 1 −1, −2.5 1.5 2.5 3.5 −2.5 1.5 −3.5)=(−2.5+(−1.5)+(−2.5)+3.5+(−2.5)+1.5+3.5)/7=−0.5/7;

corr(1 −1 −1 1 1 1 −1, 1.5 3.5 −2.5 2.5 −3.5 −3.5 2.5)=(1.5+(−3.5)+2.5+2.5+(−3.5)+(−3.5)+(−2.5))/7=−6.5/7;

corr(1 −1 −1 1 1 1 −1, 2.5 3.5 −2.5 1.5 −3.5 −2.5 1.5)=(2.5+(−3.5)+2.5+1.5+(−3.5)+(−2.5)+(−1.5))/7=−4.5/7;

corr(1 −1 −1 1 1 1 −1, −2.5 2.5 −3.5 −3.5 2.5 1.5 3.5)=(−2.5+(−2.5)+3.5+3.5+2.5+1.5+(−3.5))/7=2.5/7;

corr(1 −1 −1 1 1 1 −1, −2.5 1.5 −3.5 −2.5 1.5 2.5 3.5)=(−2.5+(−1.5)+3.5+(−2.5)+1.5+2.5+(−3.5))/7=−2.5/7; and corr(1 −1 −1 1 1 1 −1, −3.5 −3.5 2.5 1.5 3.5 −2.5 2.5)=(−3.5+3.5+(−2.5)+1.5+3.5+(−2.5)+(−2.5))/7=−2.5/7.

With these correlation values, the decision result can be generated according to the comparison result of the maximum correlation value and the at least one threshold in the following procedure as it is described before. Similarly, if the frequency of the transmission clock is 1/M times the frequency of the reception clock (in which the M, for instance, could be the $M_{th}$ power of 2) and the other conditions are appropriate, the correlation-value generating circuit 140 can comprise M correlation-value generating units which are able to process the M sets of divisional sequences derived from the reception sequences one on one, and thereby generate the correlation values. Please note that if the calculation resource of the correlation-value generating circuit 140 is sufficient, a single circuit or fewer correlation-value generating units instead of M correlation-value generating units would be enough to process the M sets of divisional sequences.

In the above example, since the delay interval between sampling timings (i.e. the delay interval equivalent to four reception clocks) is relatively wide, although the maximum correlation value among all the correlation values is 2.5/7, it could be a bit far from the actual maximum correlation value. In view of this problem, the decision circuit 150 could be operable to determine whether an initial relation between any of the already generated p correlation values (in which p is an integer less than n) and the aforementioned at least one threshold (e.g. an initial threshold among several thresholds) satisfies the at least one predetermined condition (e.g. an initial condition among several predetermined conditions), so as to generate an initial decision result. Afterwards, if the initial decision result indicates that the predetermined condition has been fulfilled, the reception circuit 130 may adjust the aforementioned delay sampling arrangement (e.g. to reduce the delay interval between sampling timings) in accordance with the initial decision result, so as to carry out more dense sampling for the following decision making from the specified sampling timing in connection with the correlation value failing to reach the threshold. In other words, after adjusting the sampling delay arrangement, within the same duration, the reception circuit 130 is operable to generate more sets of reception sequences for the correlation-value generating circuit 140 to generate more correlation values which allow the decision circuit 150 to make the decision more accurately. Similarly, if the correlation-value generating circuit 140 executes the correlation calculation in accordance with the voltage levels of one set of reception sequence and plural sets (e.g. A sets) of the test sequences of different phases, the decision circuit 150 is operable to generate an initial decision result according to the already generated correlation values in the same way, and then the reception-end test sequence generating circuit 160 is operable to generate plural sets (e.g. B sets) of the test sequences of reduced phase difference according to the initial decision result for the execution of correlation calculation. Apparently, the average phase difference of the B sets of the test sequences will be less than the average phase difference of the A sets of the test sequences. Please note that the above-described manner is not only able to improve the accuracy of decision, but also able to accelerate the rate of decision making. In brief, the decision circuit 150 is operable to quickly find out a correlation value satisfying the at least one predetermined condition by a wider sampling timing delay interval or phase difference, and then have the related circuits execute the correlation calculation more accurately by reducing the sampling timing delay interval or phase difference.

Please note that the specific circuit examples of the above-disclosed embodiments and the specific values of sequences or levels are merely for those of ordinary skill in the art to understand the present invention. As long as an implementation is practicable, a person skilled in the art may make alterations in the present invention.

Figure 7:
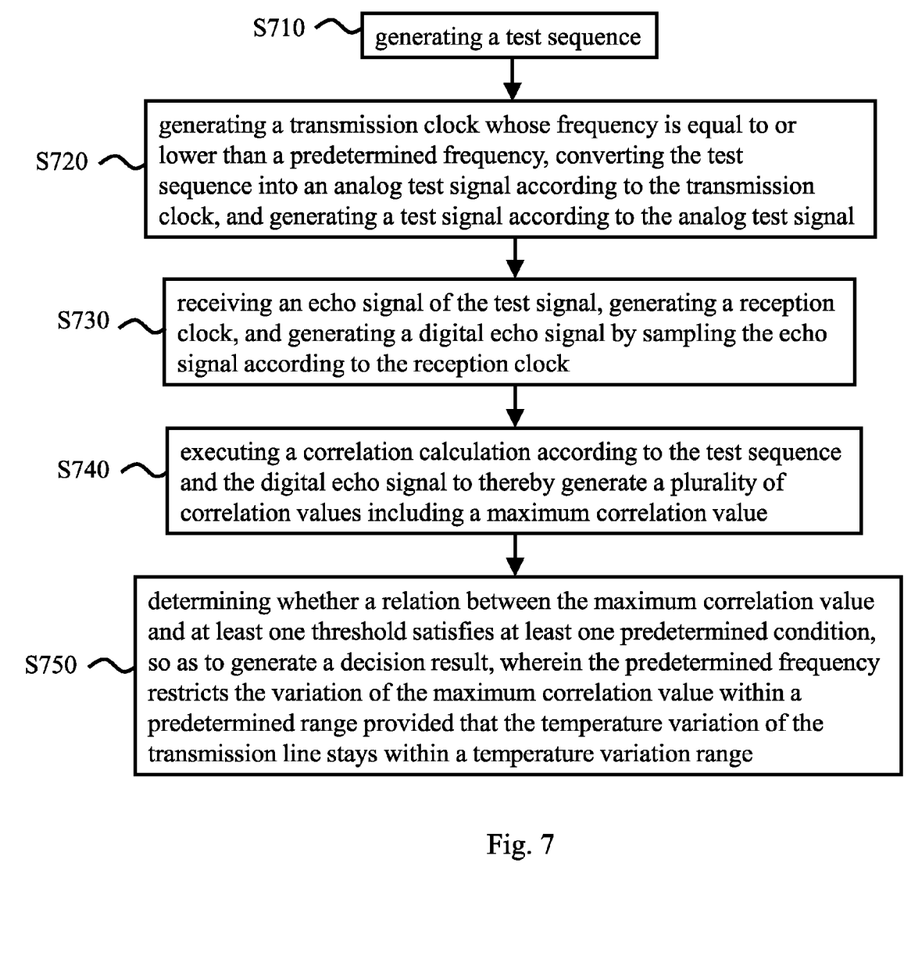
FIG. 7 illustrates an embodiment of the temperature insensitive testing method of the present invention.

In addition to the above-described device invention, the present invention also discloses a temperature insensitive testing method comprising the following steps:

Step S710: generating a test sequence. This step can be carried out by the transmission-end test sequence generating circuit 110 in FIG. 1 or its equivalent.

Step S720: generating a transmission clock whose frequency is equal to or lower than a predetermined frequency, converting the test sequence into an analog test signal according to the transmission clock, and generating a test signal according to the analog test signal. This step can be carried out by the transmission circuit 120 in FIG. 1 or its equivalent.

Step S730: receiving an echo signal of the test signal, generating a reception clock, and generating a digital echo signal by sampling the echo signal according to the reception clock. This step can be carried out by the reception circuit 130 in FIG. 1 or its equivalent.

Step S740: executing a correlation calculation according to the test sequence and the digital echo signal to thereby generate a plurality of correlation values including a maximum correlation value. This step can be carried out by the correlation-value generating circuit 140 in FIG. 1 or its equivalent.

Step S750: determining whether a relation between the maximum correlation value and at least one threshold satisfies at least one predetermined condition, so as to generate a decision result, wherein the predetermined frequency restricts the variation of the maximum correlation value within a predetermined range provided that the temperature variation of a concerned transmission line stays within a temperature variation range. This step can be carried out by the decision circuit 150 in FIG. 1 or its equivalent.

Since those of ordinary skill in the art can appreciate the implementation detail and the modification thereof of this method invention including the type of test sequence, the setting of clock, the control of sampling, the manner of generating correlation values, the execution and acceleration of decision making, and etc. by referring to the fore-illustrated device invention, repeated and redundant description is therefore omitted provided that the remaining disclosure is still enough for understanding and enablement. Besides, the shape, size, and ratio of any element and the step sequence of any flow chart in the figures are just exemplary for understanding, not for limiting the scope of this invention. Furthermore, each embodiment in the foregoing description includes one or more features; however, this doesn't mean that one carrying out the present invention should make use of all the features of one embodiment at the same time, or should only carry out different embodiments separately. In other words, if an implementation derived from one or more of the embodiments is practicable, a person of ordinary skill in the art can selectively make use of some or all of the features in one embodiment or selectively make use of the combination of some or all features in several embodiments to have the implementation come true, so as to increase the flexibility of carrying out the present invention.

To sum up. The temperature insensitive testing device and method have at least the following advantages: the capability of determining the characteristic or status of a transmission line relatively accurately even though the temperature varies violently; the capability of determining the characteristic or status of the transmission line without the update of parameters or thresholds as long as the variation of a concerned factor stays within a tolerable range, which therefore simplifies the procedure of decision making and saves the cost of updating parameters or thresholds; the capability of determining the characteristic or status of the transmission line without the execution of temperature detection, which therefore prevents the problem of inaccurate temperature detection results and saves the cost of using a temperature detecting element.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A temperature insensitive testing device capable of outputting a test signal through a transmission line and generating a test result, comprising:
   a transmission-end test sequence generating circuit operable to generate a test sequence;
   a transmission circuit including:
      a transmission clock generating unit operable to generate a transmission clock whose frequency is equal to or lower than a predetermined frequency;
      a digital-to-analog converter operable to convert the test sequence into an analog test signal according to the transmission clock; and
      a transmission interface circuit operable to generate the test signal according to the analog test signal;
   a reception circuit including:
      a reception interface circuit operable to receive an echo signal of the test signal;
      a reception clock generating unit operable to generate a reception clock; and
      an analog-to-digital converter operable generate a digital echo signal by sampling the echo signal according to the reception clock;
   a correlation-value generating circuit operable to execute a correlation calculation according to the test sequence and the digital echo signal to thereby generate a plurality of correlation values including a maximum correlation value, the correlation-value generating circuit including: a multiplier to multiply the test sequence by the digital echo signal and generate a current multiplication value, an adder to sum up a preceding addition value and the current multiplication value and generate a current addition value, and a delay element to delay the current addition value and generate the preceding addition value, in which one of the adder and the delay element is operable to output the plurality of correlation values; and
   a decision circuit operable to determine whether the maximum correlation value is greater than at least one threshold, so as to generate a decision result,
   wherein the predetermined frequency restricts a variation of the maximum correlation value within a predetermined range provided that the temperature variation of the transmission line stays within a temperature variation range; the analog-to-digital converter samples the echo signal according to a sampling delay arrangement to thereby generate A sets of reception sequences successively, in which the A is an integer greater than 1 and the correlation-value generating circuit carries out the correlation calculation by correlating each of the A sets of reception sequences with the test sequence to thereby generate at least a part of the plurality of correlation values; the decision circuit is operable to further determine whether one of the at least a part of the correlation values is greater than the at least one threshold to thereby generate an initial decision result, and if the initial decision result indicates that the one of the at least a part of the correlation values is greater than the at least one threshold, the analog-to-digital converter makes an alteration in the sampling delay arrangement according to the initial decision result to thereby generate B sets of reception sequences successively, in which the B is an integer greater than 1 and the sampling density of the sampling delay arrangement after the alteration is higher than the sampling density of the sampling delay arrangement before the alteration.

2. The temperature insensitive testing device of claim 1, wherein the test sequence is a pseudo-noise sequence or the sequence derived therefrom.

3. The temperature insensitive testing device of claim 1, further comprising:
   a reception-end test sequence generating circuit operable to generate the test sequence for the execution of the correlation calculation.

4. A temperature insensitive testing device capable of outputting a test signal through a transmission line and generating a test result, comprising:
   a transmission-end test sequence generating circuit operable to generate a test sequence;
   a transmission circuit including:
      a transmission clock generating unit operable to generate a transmission clock whose frequency is equal to or lower than a predetermined frequency;
      a digital-to-analog converter operable to convert the test sequence into an analog test signal according to the transmission clock; and
      a transmission interface circuit operable to generate the test signal according to the analog test signal;
   a reception circuit including:
      a reception interface circuit operable to receive an echo signal of the test signal;
      a reception clock generating unit operable to generate a reception clock; and
      an analog-to-digital converter operable generate a digital echo signal by sampling the echo signal according to the reception clock;
   a correlation-value generating circuit operable to execute a correlation calculation according to the test sequence and the digital echo signal to thereby generate a plurality of correlation values including a maximum correlation value; and
   a decision circuit operable to determine whether a relation between the maximum correlation value and at least one threshold satisfies at least one predetermined condition, so as to generate a decision result,
   wherein the predetermined frequency restricts a variation of the maximum correlation value within a predetermined range provided that the temperature variation of the transmission line stays within a temperature variation range, the analog-to-digital converter samples the echo signal according to a sampling delay arrangement to thereby generate A sets of reception sequences successively, the A is an integer more than 1 and the correlation-value generating circuit carries out the correlation calculation by correlating each of the A sets of reception sequences with the test sequence to thereby generate the plurality of correlation values, the decision circuit is operable to further determine whether an initial relation between one of the correlation values and the at least one threshold satisfies the predetermined condition to thereby generate an initial decision result, and if the initial decision result indicates that the initial relation has satisfied the predetermined condition, the analog-to-digital converter makes an alteration in the sampling delay arrangement according to the initial decision result to thereby generate B set(s) of reception sequence successively, in which the B is a positive integer and the sampling density of the sampling delay arrangement after the alteration is higher than the sampling density of the sampling delay arrangement before the alteration.

5. The temperature insensitive testing device of claim 1, wherein the predetermined frequency is equal to or less than 31.25 MHz.

6. The temperature insensitive testing device of claim 1, wherein the temperature variation range is a range between −40° C. and 80° C.

7. The temperature insensitive testing device of claim 6, wherein the predetermined range stays within 3 dB.

8. The temperature insensitive testing device of claim 1, wherein the frequency of the reception clock is M times the frequency of the transmission clock, in which the M is a positive integer.

9. The temperature insensitive testing device of claim 8, wherein the correlation-value generating circuit includes M sets of correlation-value generating units and divides the digital echo signal into M sets, and the M sets of correlation-value generating units process the M sets of the digital echo signal one on one to generate the plurality of correlation values.

10. A temperature insensitive testing method capable of outputting a test signal through a transmission line and generating a test result, comprising the following steps:
   generating a test sequence;
   a transmission step including:
      generating a transmission clock whose frequency is equal to or lower than a predetermined frequency;
      converting the test sequence into an analog test signal according to the transmission clock; and
      generating the test signal according to the analog test signal;
   a reception step including:
      receiving an echo signal of the test signal;
      generating a reception clock; and
      generating a digital echo signal by sampling the echo signal according to the reception clock;
      executing a correlation calculation according to the test sequence and the digital echo signal to thereby generate a plurality of correlation values including a maximum correlation value, the step of executing the correlation calculation including: multiplying the test sequence by the digital echo signal and generating a current multiplication value, summing up a preceding addition value and the current multiplication value and generating a current addition value, and delaying the current addition value and generating the preceding addition value; and
      determining whether the maximum correlation value is greater than at least one threshold, so as to generate a decision result,
   wherein the predetermined frequency restricts a variation of the maximum correlation value within a predetermined range provided that the temperature variation of the transmission line stays within a temperature variation range; the step of generating the digital echo signal includes: sampling the echo signal according to a sampling delay arrangement to thereby generate A sets of reception sequences successively, in which the A is an integer greater than 1; the step of generating the plurality of correlation values includes: correlating each of the A sets of reception sequences with the test sequence to thereby generate at least a part of the plurality of correlation values; the step of generating the decision result includes: determining whether one of the at least a part of the correlation values is greater than the at least one threshold to thereby generate an initial decision result; and if the initial decision result indicates that the one of the at least a part of the correlation values is greater than the at least one threshold, the step of generating the digital echo signal includes: making an alteration in the sampling delay arrangement according to the initial decision result to thereby generate B sets of reception sequences successively, in which the B is an integer greater than one and the sampling density of the sampling delay arrangement after the alteration is higher than the sampling density of the sampling delay arrangement before the alteration.

11. The temperature insensitive testing method of claim 10, wherein the test sequence is a pseudo-noise sequence or the sequence derived therefrom.

12. The temperature insensitive testing method of claim 10, wherein the frequency of the reception clock is M times the frequency of the transmission clock, in which the M is a positive integer.

13. The temperature insensitive testing method of claim 12, wherein the step of generating the plurality of correlation values includes:
  dividing the digital echo signal into M sets; and
  processing the M sets of the digital echo signal respectively to generate the plurality of correlation values.

* * * * *